United States Patent
Nagai et al.

(10) Patent No.: US 6,939,620 B2
(45) Date of Patent: *Sep. 6, 2005

(54) COPPER ALLOY FOIL

(75) Inventors: Hifumi Nagai, Hitachi (JP); Toshiteru Nonaka, Hitachi (JP)

(73) Assignee: Nikko Metal Manufacturing Co., Ltd., Ibaraki-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/189,043

(22) Filed: Jul. 3, 2002

(65) Prior Publication Data

US 2003/0121697 A1 Jul. 3, 2003

(30) Foreign Application Priority Data

Jul. 4, 2001 (JP) .......................................... 2001-204018
Jul. 13, 2001 (JP) .......................................... 2001-214464

(51) Int. Cl.⁷ .............................. B32B 15/08; C22F 1/08
(52) U.S. Cl. ....................... 428/606; 428/607; 428/687; 428/457; 428/416
(58) Field of Search ................................ 428/606, 607, 428/687, 612, 457, 458, 418, 416; 420/492, 495

(56) References Cited

FOREIGN PATENT DOCUMENTS

JP          07-054079      *   2/1995

* cited by examiner

*Primary Examiner*—John J. Zimmerman
(74) *Attorney, Agent, or Firm*—Jordan and Hamburg LLP

(57) ABSTRACT

For a three-layer flexible board, there is provided a copper alloy foil that requires no roughening processing, that has good adhesion with an adhesive containing an epoxy resin, that can be laminated to form a copper-clad laminate, that has a low surface roughness, and that has high conductivity and strength. The copper alloy of the foil contains at least one of 0.01–2.0 weight percent Cr and 0.01–1.0 weight percent Zr or contains 1.0–4.8 weight percent Ni and 0.2–1.4 weight percent Si. Good adhesion of the copper alloy foil to a resin substrate with an adhesive containing an epoxy resin is obtained by setting the thickness of the anticorrosive coating to less than 3 nm; the surface roughness of the copper alloy foil is below 2 μm expressed as ten-point average surface roughness (Rz); and, without roughening processing, the 180° C. peel strength, after adhesion of the copper alloy foil to the board film by means of an adhesive containing an epoxy resin, is greater than 8.0 N/cm.

28 Claims, No Drawings

COPPER ALLOY FOIL

BACKGROUND OF THE INVENTION

The present invention relates to a copper alloy foil used in a laminate for a printed wiring board.

Printed wiring boards are used frequently in the electronic circuitry of electronic equipment. Printed wiring boards are classified broadly as either rigid laminates (i.e., rigid boards) or flexible laminates (i.e., flexible boards), according to the type of resin serving as the base material. Flexible boards, which are characterized by flexibility, are used not only for wiring in flexible regions but also as space-saving wiring material, because they can be housed within electronic equipment in a folded state. Also, because the board itself is thin, it also can be used in semiconductor package interposer applications and as an IC tape carrier in liquid-crystal displays. Although polyimide resin films and polyester resin films are used as the base material of a flexible board, polyimide is frequently used at present because of its heat resistance. Because of its conductivity, copper generally is used as the conductive material in a flexible board. In a printed wiring board, the copper foil of the copper-clad laminate is etched to form various wiring patterns, after which electronic components are connected and mounted. The term "resin" as used throughout the present specification and claims means "synthetic polymer".

Structurally, a flexible board is either a two-layer flexible board or a three-layer flexible board. A two-layer flexible board is structured such that copper, the conductive material, is directly bonded to a resin (e.g., polyimide). On the other hand, a three-layer flexible board is structured such that a resin film (e.g., polyimide) and a copper foil, the conductive material, are bonded by means of an adhesive containing a resin such as an epoxy resin, an acrylic resin, and the like. However, a three-layer flexible board is widely used because it has good adhesion and is inexpensive. Because of such structural differences, the resin bonded with copper in a flexible board is polyimide in a two-layer flexible board, and is a resin contained in the adhesive used in a three-layer flexible board.

The adhesive used in a three-layer flexible board must have properties such as heat resistance, durability, and flexibility, so the strength and the glass transition temperature are regulated by mixing various resins. However, one consisting principally of an epoxy resin generally is used. The adhesive used in this application is a solvent or sheet adhesive that contains an elastomer or nitrile rubber that imparts flexibility as well as a curing agent (e.g., amine) in an epoxy resin, such as diglycidyl ether of bisphenol A or glycidyl ester of bisphenol A, for example. Regarding the methods used to produce a copper-clad laminate, generally a polyimide film is coated with a solvent adhesive and this is dried, after which copper foil is superposed; or a sheet adhesive is interposed between a polyimide film and copper foil, and a roll press or flat hot press is used to tentatively adhere them, after which they are adhered further by thermosetting, at 100–200° C., from several tens of minutes to as many as several hours.

In a printed wiring board, the following problem occurs: When solder is used to connect and mount electronic components, the difference in the coefficients of thermal expansion of the copper foil and the resin results in thermal stress, so if the adhesion between the copper foil and the resin is poor, peeling or delamination will occur. As a result, to improve the adhesion between the resin and copper foil used in a copper-clad laminate, the copper foil is subjected to a roughening process that forms copper particles on the surface by means of electroplating. This improves the adhesion by means of the so-called anchor effect, which roughens the surface of the copper foil and causes the copper foil to bite into the resin, thereby yielding a mechanical adhesive strength.

On the other hand, with the miniaturization, weight-saving, and enhanced functionality of electronic equipment in recent years, there has been increased demand for high-density mounting on printed wiring boards, resulting in finer pitches with narrower line or wire widths and line or wire spacing in electronic circuits. If copper foil with high surface roughness or copper foil with irregularities formed by a roughening process is used as the conductive material, when a circuit is formed by etching, etching residue containing residual copper remains in the resin, so the etching linearity drops, leading to nonuniform circuit widths. As a result, copper foil with low surface roughness is preferable, to enable finer pitches in an electronic circuit. Also, higher-frequency electrical signals are being utilized in electronic equipment (e.g., PCs, mobile telecommunications). When the electrical signal frequency exceeds 1 GHz, the skin effect (i.e., the flow of electrons only on the surface of a conductor) becomes significant, so the effect of variation in the transmission path caused by surface irregularities can no longer be disregarded. Therefore, attempts were made to reduce the surface roughness of the copper foil, because of the high-frequency characteristics.

The copper foil that serves as the conductive material in a printed wiring board is classified as a rolled copper foil or an electrolytic copper foil, depending on its production process. Electrolytic copper foil generally is produced by electrolytically depositing copper from a sulfurically acidic copper sulfate plating bath onto a titanium or stainless steel drum. Irregularities are formed on the copper foil during electrolytic deposition, so the surface roughness increases. Recently, production has begun of so-called low-profile foil, which is copper foil produced by adding additives to the plating bath and then regulating the electrolytic deposition conditions to reduce the surface roughness. Rolled copper foil is produced by using a rolling roll to plastically form it, so the surface pattern of the rolling roll is transferred to the foil surface, thereby yielding a smooth surface. Furthermore, the foil generally is less than 100 µm thick.

As aforementioned, the copper foil used in a copper-clad laminate currently is subjected to a roughening process, to improve its adhesion to the resin. For the aforesaid reasons, however, it is desirable to bond a copper foil with little surface roughness to a resin film, without performing roughening processing, so it is necessary to maintain the adhesive strength without performing roughening processing. Also, in a three-layer flexible board, measures were taken such as an attempt to coat copper foil with a silane coupling agent and so forth, in order to improve the adhesive strengths of the copper foil, which is a metal, and the adhesive, which is an organic material. However, sufficient adhesiveness was not obtained.

A copper alloy containing pure copper and small quantities of additional elements is used as the raw material of the copper foil used as the conductive material. As finer pitches are utilized in electronic circuits, the copper foil (i.e., the conductive material) thins and the circuit narrows, so two copper foil properties are desired: low DC resistance loss and high conductivity. Copper is a material with excellent conductivity, so pure copper with a high purity (above 99.9%) generally is used in the aforesaid field, where conductivity is important. However, copper's strength decreases as its purity increases, so if the copper foil is thinned, its handleability deteriorates, so a high copper foil strength is preferable.

Under such circumstances, an attempt was made to bond the copper foil (i.e., the conductive material) to a polyimide film by using an adhesive containing an epoxy resin, without subjecting it to roughening processing. However, it was ascertained that the polyimide film and the rolled high purity copper foil peeled apart easily, and peeling occurred easily at the interface between the epoxy resin and the copper. As a result, copper foil (i.e., the conductive material) not subjected to roughening processing has not reached practical application because there is a problem: The copper foil and the epoxy resin, the principal component of the adhesive, peel apart, so defects (e.g., disconnection) result.

SUMMARY OF THE INVENTION

By improving the adhesion when producing a three-layer printed wiring board by bonding the polyimide resin film (i.e., the base material) and the copper foil (i.e., the conductive material) with an adhesive containing an epoxy resin, the present invention supplies, without special processing such as roughening processing, a copper alloy foil for a laminate that yields a copper foil surface roughness (Rz) of less than 2 $\mu$m; a tensile strength exceeding 600 N/mm$^2$, preferably exceeding 650 N/mm$^2$; for a copper alloy foil with superior conductivity, a target conductivity exceeding 40% IACS, preferably 60% IACS; and an adhesive strength exceeding 8.0 N/cm in 180° peel strength.

After studying the adhesiveness resulting from the bonding of a polyimide resin film and a conductive copper foil by means of an adhesive containing an epoxy resin, the inventors ascertained that adhesion was improved by using a copper alloy that was based on pure copper, which has excellent conductivity, and that contained small quantities of additional elements; and that adhesion decreased as the copper alloy foil's anticorrosive coating thickened. Concretely, as a result of considerable research regarding the effects of various additional elements on the adhesion to adhesives containing an epoxy resin and regarding the relationship between the anticorrosive coating thickness and the adhesiveness, the present invention supplies provides (1) a copper alloy foil for a laminate, characterized in that it contains at least one of the components Cr (0.01–2.0 weight percent) and Zr (0.01–1.0 weight percent), and the remainder consists of copper and unavoidable impurities; it has characteristics such that the anticorrosive coating thickness is less than 3 nm, the surface roughness is less than 2 $\mu$m expressed as ten-point average surface roughness (Rz), the tensile strength is greater than 600 N/mm$^2$, and the conductivity is greater than 60% IACS; it requires no roughening process; and the 180° peel strength between the copper alloy foil and an adhesive containing an epoxy resin is greater than 8.0 N/cm, when the copper alloy foil is bonded to the board resin by means of the adhesive containing an epoxy resin; and (2) a copper alloy foil for a laminate, characterized in that it contains 1.0–4.8 weight percent Ni and 0.2–1.4 weight percent Si, and the remainder consists of copper and unavoidable impurities; it has characteristics such that the anticorrosive coating thickness is less than 3 nm, the surface roughness is less than 2 $\mu$m expressed as ten-point average surface roughness (Rz), the tensile strength is greater than 650 N/mm$^2$, and the conductivity is greater than 40% IACS; it requires no roughening process; and the 180° peel strength between the copper alloy foil and an adhesive containing an epoxy resin is greater than 8.0 N/cm, when the copper alloy foil is bonded to the board resin by means of the adhesive containing an epoxy resin.

Also, in the present invention, Ag, Al, Be, Co, Fe, Ni, Mg, P, Pb, Si, Sn, Ti, and Zn each has the effect of increasing the strength of a copper alloy by means of solid solution strengthening or hardening, so one or more of these elements can be added to the copper alloys of the invention but proportions of Ni and Si to be used in embodiment (2) are only those within the ranges stated hereinabove in the summary of embodiment (2). If the total content is less than 0.005 weight percent, the aforesaid desired effect cannot be obtained. If it exceeds 2.5 weight percent, the conductivity, solderability, and workability deteriorate considerably, so the total contents of Ag, Al, Be, Co, Fe, Ni, Mg, P, Pb, Si, Sn, Ti, and Zn can be within the range 0.005–2.5 weight percent, but with the aforementioned exception for the proportions of Ni and Si in embodiment (2).

The reasons for the aforesaid limitations on the surface state, the alloy composition, and so forth, in the present invention will be discussed next.

(1) Anticorrosive coating: Tarnishment of pure copper and copper alloys commonly is prevented by using an organic compound containing nitrogen (e.g., benzotriazole, imidazole) to form a chelate with the copper on the surface, thereby forming an anticorrosive coating. On the other hand, these anticorrosive coatings are water-repellent, so they inhibit epoxy resin bonding, thereby reducing adhesion. So, by limiting the anticorrosive coating thickness to less than 3 nm from the surface, it becomes possible to securely adhere the copper alloy foil and the polyimide film by using an adhesive containing an epoxy resin. The anticorrosive coating thickness can be reduced by reducing the concentration of the anticorrosive agent, for example. When using benzotriazole as the anticorrosive agent, it is preferable to reduce the concentration to less than 3000 ppm. The thickness of the anticorrosive coating can be quantified by measuring by means of Auger electron spectroscopy. That is, Auger electron spectroscopy can be used to analyze in the depth direction. So the depth from the surface of the copper alloy foil to the point at which the detected intensity of nitrogen, the element that constitutes the anticorrosive agent, equals that of the background is measured.

(2) Cr, Zr: It is known that, during the production of a resin, Cr and Zr function as catalysts that promote polymerization. As a result, it is believed that the addition of these to copper during alloy foil production promotes bonding between the metal and the epoxy resin, the principal component of the adhesive, thereby strengthening the interfacial bond. If too little of these is added, their catalytic function is insufficient, so the metal and the resin are bonded insufficiently, resulting in little improvement in adhesion. It is necessary to impart a 180° peel strength of at least 8.0 N/cm to avoid problems during its application to printed wiring boards. It was determined that, to obtain this property, the added amount of at least either Cr or Zr must be greater than 0.01 weight percent. On the other hand, when more is added, coarse crystallization products result from segregation during casting. The metal material containing the coarse crystallization products develops cracks during hot rolling, so the hot rollability deteriorates. Also, as finer pitches are utilized in electronic circuits, the copper foil (i.e., the conductor) thins and the circuit narrows, so two copper foil properties are desired: low DC resistance loss and high conductivity. Moreover, when more is added, the conductivity sometimes drops. The maximum added amounts of Cr and Zr at which these problems do not occur are, respectively and by weight, 2.0 percent, more preferably 0.4 percent, for Cr, and 1.0 percent, more preferably 0.25 percent, for Zr. This is because plastic forming is performed easily. Therefore, for the copper alloy foil for the laminate of a printed wiring board, the appropriate ranges of the added alloy components are, by weight, 0.01–2.0 percent, more preferably 0.01–0.4 percent, for Cr; and 0.01–1.0 percent, more preferably 0.01–0.25 percent, for Zr.

(3) Ni, Si: It is known that Ni functions as a catalyst that promotes polymerization during the production of a resin. As a result, it is believed that the addition of Ni to copper during alloy foil production promotes bonding between the metal and the epoxy resin, the principal component of the adhesive, thereby strengthening the interfacial bond. If too little of this is added, its catalytic function is insufficient, so the metal and the resin are bonded insufficiently, resulting in little improvement in adhesion. It is necessary to impart a 180° peel strength of at least 8.0 N/cm to avoid problems during its application to printed wiring boards. Also, Si forms the precipitate $Ni_2Si$ with Ni, which has the effects of increasing the copper's strength and increasing the conductivity. At Ni contents less than 1.0 weight percent or at Si contents less than 0.2 weight percent, the desired strength is not obtained as a result of the aforesaid behavior.

1.0–4.8 percent, more preferably 1.0–3.0 percent, for Ni; and 0.2–1.4 percent, more preferably 0.2–1.0 percent, for Si.

(4) Surface roughness: When the copper alloy's surface roughness increases, the skin effect, by which current flows only in the surface of a conductor when the electric signal frequency exceeds 1 GHz, increases the impedance, thereby affecting the transmission of high-frequency signals. So, it is necessary to reduce the surface roughness of conductive materials in high-frequency circuit applications. The relationship between the surface roughness and the high-frequency characteristics was studied. As a result, it was determined that the surface roughness of copper alloy foil for the laminate of a printed wiring board should be less than 2 $\mu$m expressed as ten-point average surface roughness (Rz). Methods of reducing the surface roughness include optimizing the conditions used for the production of rolled copper foil and electrolytic copper foil, and chemically polishing or electrolytically polishing the copper foil surface. It generally is possible to easily reduce the surface roughness of the work roll of the rolling mill, thereby reducing the work roll profile transferred to the copper foil.

(5) Tensile strength and conductivity: Strength and conductivity generally are related inversely, so the higher the material strength, the lower the conductivity tends to be. When the tensile strength is less than 600 N/mm$^2$, handling, and so forth, readily produces wrinkles. Also, when the conductivity is below 40% IACS, it is undesirable as a conductive material for a laminate. Conditions suitable for a copper alloy foil for a laminate are a tensile strength greater than 600 N/mm$^2$, and a conductivity greater than 40% IACS. A tensile strength greater than 650 N/mm$^2$ is preferable for a copper alloy foil for a laminate, that has high strength and superior handling. A conductivity greater than 60% IACS is preferable for a copper alloy foil for a laminate, that has excellent conductivity.

(6) 180° peel strength: When the 180° peel strength is low, there is danger of peeling from the laminate, so an adhesive strength, i.e., a 180° peel strength, greater than 8.0 N/cm is required.

The copper alloy foil of the present invention is in no way limited in the production method. For example, it is possible to use a rolled copper foil production method in which an alloy or an electrolytic copper foil produced by means of an alloy plating method is fused, cast, and rolled. An example rolling method will be discussed next. Predetermined quantities of alloy elements are added to fused, pure copper, after which this is cast in a mold to create an ingot. In the present invention, to inhibit the generation of oxides, etc., it is preferable to perform this in a vacuum or in an inert gas atmosphere. It also is preferable to use electrolytic copper with a low oxygen content or oxygen-free copper as the raw material. Hot rolling is used to thin the ingot to a certain thickness, after which the top layer is scraped off and the ingot is subjected to repeated cold rolling and annealing. Finally, cold rolling is performed to finish the foil. The rolling-finished material is coated with rolling oil, so acetone, a petroleum solvent, or the like is used for degreasing.

If an oxide layer is formed during annealing, it will cause trouble in subsequent processing, so it is necessary either to perform annealing in a vacuum or in an inert gas atmosphere, or to remove the oxide layer after annealing. For example, to remove the oxide layer by picking, it is preferable to use sulfuric acid+ hydrogen peroxide, nitric acid+ hydrogen peroxide, or sulfuric acid+ hydrogen peroxide+ fluoride.

DETAILED DESCRIPTION OF THE INVENTION

The embodiments of the present invention will be explained next.

For copper alloy production, oxygen-free copper, the principal raw material, was fused in an Ar atmosphere in a high-purity graphite crucible by using a high-frequency vacuum induction melting furnace; to this were added, as auxiliary materials, additional materials selected from among a copper-chrome master alloy, a copper-zirconium master alloy, aluminum, silver, a copper-beryllium master alloy, cobalt, iron, magnesium, nickel, a copper-phosphorus master alloy, lead, a copper-silicon master alloy, tin, titanium, and zinc; and this was then cast in a mold. This method yielded a copper alloy ingot that was 30 mm thick, 50 mm wide, 150 mm long, and weighed approximately 2 kg. This ingot was heated to 900° C., and hot rolling was used to roll it to a thickness of 8 mm. The oxide scale was then removed, after which cold rolling and various heat treatments were performed to obtain a copper alloy foil rolled to a thickness of 35 $\mu$m.

Rolling oil adhered to the 35-$\mu$m-thick copper alloy foil obtained by means of the aforesaid method, so the foil was immersed in acetone to remove the oil. It was then immersed in an aqueous solution containing 10 weight percent sulfuric acid and 1 weight percent hydrogen peroxide, to remove the surface oxide layer and the anticorrosive coating. To investigate the effects of the anticorrosive coating thickness, the foil was then immersed in an aqueous solution with a regulated benzotriazole concentration and then dried immediately. Other than this, no special surface processing (e.g., roughening processing, silane coupling processing) was used to improve adhesion. A copper-clad laminate was fabricated by adhering the copper alloy foil produced in this manner to a polyimide film, by means of an adhesive containing an epoxy resin. In the fabrication of the copper-clad laminate, an applicator with a 100-$\mu$m gap was used to apply, to a 25-$\mu$m-thick polyimide film, a solvent adhesive containing a mixture of epoxy resin and curing agent, after which this was dried at 130° C. for 4 min. in a dryer. Then the aforesaid copper alloy foil was superposed, after which the laminate was held for 30 min. by a flat hot press, at 170° C. temperature and 30-kgf/cm² pressure, thereby yielding the copper-clad laminate. Here, the post-drying adhesive thickness was 20 μm.

The following methods were used to evaluate the hot rollability, surface roughness, anticorrosive coating thickness, conductivity, high-frequency characteristics, tensile strength, and adhesive strength of the copper alloy foil obtained in this manner.

(1) Hot rollability: The hot rollability was evaluated by subjecting the hot-rolled material to penetrant inspection and by visually inspecting the exterior for cracks in the material.
(2) Surface roughness: The surface roughness was measured transversely to the rolling direction by using a stylus-type surface roughness tester. The measurement conditions complied with the method described in JIS B 0601, and the surface roughness was evaluated by using the ten-point average surface roughness (Rz).
(3) Anticorrosive coating thickness: As mentioned previously, Auger electron spectroscopy was used to perform depth profiling, and the depths from the surface to the points at which the detected intensity of nitrogen (i.e., the element that constituted the anticorrosive agent) equaled the background were measured.
(4) Conductivity: Regarding the conductivity, the electrical resistance at 20° C. was determined by using a DC four-probe method that utilized a double bridge. For the measurement sample, copper foil processed to a thickness of 35 μm was cut to a width of 12.7 mm. The conductivity was determined by measuring the electrical resistance at an inter-measurement length of 50 mm.
(5) High-frequency characteristics: The high-frequency characteristics were evaluated by using the impedance when a high-frequency current circulated. The impedance was determined tester side, and the copper alloy coil (i.e., the conductor) was bent in the 180° direction and peeled at a tension speed of 50 mm/min.

(1) Embodiment 1

Table 1 lists the composition of the copper alloy foil containing at least one of Cr and Zr according to the first embodiment of the invention, and Table 2 lists the results of the evaluation of the properties of the copper alloy foil. In each case, the oxygen content was at most 10 ppm. Furthermore, a hyphen (-) in the table indicates that no measurement was taken. This is because, in the copper alloy foil containing Zn or Pb, there was considerable evaporation of alloy components during oxygen analysis, so accurate measurement of the oxygen content was impossible. It is assumed, however, that the oxygen content was at most 10 ppm in each case. Regarding hot rollability, indicates those lacking cracks after hot rolling, and 1 indicates those with cracks. Those with cracks were not subjected to subsequent testing. Examples 1–14 are embodiments of the copper alloy foil of the present invention. As is evident in Table 1, the copper alloy foil of the present invention had a conductivity exceeding 60% IACS, a tensile strength exceeding 600 N/mm², and a 180° peel strength exceeding 8.0 N/cm. It was determined that it has superior conductivity and handleability, and that it has high adhesive strength. Also, none developed cracks during hot rolling.

TABLE 1

| | Chemical Composition | | | | | | | | | | | | | | | | |
|---|---|---|---|---|---|---|---|---|---|---|---|---|---|---|---|---|---|
| | (%) | | | | | | | | | | | | | | | (ppm) | Cu & Unavoidable |
| No. | Cr | Zr | Ag | Al | Be | Co | Fe | Mg | Ni | P | Pb | Si | Sn | Ti | Zn | O | Impurities |
| Examples of the invention | | | | | | | | | | | | | | | | | |
| 1 | 0.12 | — | — | — | — | — | — | — | — | — | — | — | — | — | — | 4 | Remainder |
| 2 | 1.4 | — | — | — | — | — | — | — | — | — | — | — | — | — | — | 6 | Remainder |
| 3 | — | 0.15 | — | — | — | — | — | — | — | — | — | — | — | — | — | 4 | Remainder |
| 4 | — | 0.65 | — | — | — | — | — | — | — | — | — | — | — | — | — | 7 | Remainder |
| 5 | 0.41 | 0.38 | — | — | — | — | — | — | — | — | — | — | — | — | — | 5 | Remainder |
| 6 | 0.21 | 0.1 | — | — | — | — | — | — | — | — | — | — | — | — | 0.21 | — | Remainder |
| 7 | 0.4 | 0.21 | — | — | — | — | — | — | — | — | — | — | — | — | 0.19 | — | Remainder |
| 8 | 0.42 | — | — | — | — | — | — | — | 0.50 | — | — | — | — | 0.50 | — | 4 | Remainder |
| 9 | 0.39 | 0.16 | — | — | — | — | — | 0.10 | — | — | — | — | — | — | — | 2 | Remainder |
| 10 | 0.43 | — | — | — | — | — | 0.10 | — | — | 0.09 | 0.11 | — | — | — | — | — | Remainder |
| 11 | 0.39 | — | 0.11 | — | — | — | 0.50 | — | — | 0.06 | — | — | — | — | — | 5 | Remainder |
| 12 | 0.19 | — | — | — | — | — | — | — | — | — | 0.05 | — | 0.50 | — | — | — | Remainder |
| 13 | 0.20 | — | — | 0.21 | — | — | — | — | — | — | — | — | — | — | 0.20 | — | Remainder |
| 14 | — | 0.16 | — | — | 0.20 | 0.58 | — | — | — | — | — | — | — | — | — | 6 | Remainder |
| Comparative examples | | | | | | | | | | | | | | | | | |
| 15 | — | — | — | — | — | — | — | — | — | — | — | — | — | — | — | 4 | Remainder |
| 16 | 0.007 | — | — | — | — | — | — | — | — | — | — | — | — | — | — | 4 | Remainder |
| 17 | — | 0.004 | — | — | — | — | — | — | — | — | — | — | — | — | — | 4 | Remainder |
| 18 | 2.4 | — | — | — | — | — | — | — | — | — | — | — | — | — | — | 6 | Remainder |
| 19 | — | 1.4 | — | — | — | — | — | — | — | — | — | — | — | — | — | 10 | Remainder |
| 20 | 0.40 | 0.21 | — | — | — | — | — | — | — | — | — | — | — | — | 0.19 | — | Remainder |
| 21 | 0.40 | 0.21 | — | — | — | — | — | — | — | — | — | — | — | — | 0.19 | — | Remainder |

TABLE 2

| No. | Hot Rollability (○: good X: poor) | Surface Roughness (Rz) (μm) | Thickness of Anticorrosive Coating (nm) | Conductivity (% IACS) | Tensile Strength (N/mm$^2$) | Impedance (Ω) | 180° Peel Strength (N/cm) |
|---|---|---|---|---|---|---|---|
| Examples of the invention | | | | | | | |
| 1 | ○ | 1.1 | 1 | 87 | 620 | 2.0 | 8.9 |
| 2 | ○ | 0.9 | 1 | 70 | 780 | 2.0 | 14.5 |
| 3 | ○ | 1.1 | 2 | 90 | 620 | 1.9 | 11.4 |
| 4 | ○ | 1.0 | 2 | 70 | 680 | 2.2 | 11.6 |
| 5 | ○ | 1.0 | 1 | 82 | 650 | 1.9 | 15.8 |
| 6 | ○ | 1.1 | 1 | 75 | 720 | 2.3 | 12.7 |
| 7 | ○ | 0.8 | 1 | 80 | 740 | 1.8 | 15.6 |
| 8 | ○ | 1.2 | 2 | 68 | 790 | 2.4 | 10.6 |
| 9 | ○ | 1.1 | 1 | 77 | 680 | 2.2 | 15.5 |
| 10 | ○ | 1.2 | 2 | 82 | 660 | 2.3 | 9.5 |
| 11 | ○ | 1 | 2 | 64 | 680 | 2.4 | 11.1 |
| 12 | ○ | 0.8 | 1 | 84 | 660 | 1.7 | 12.4 |
| 13 | ○ | 0.9 | 1 | 83 | 680 | 2.1 | 13.9 |
| 14 | ○ | 0.8 | 2 | 66 | 800 | 2.0 | 9.7 |
| Comparative examples | | | | | | | |
| 15 | ○ | 1.4 | 1 | 99 | 400 | 2.6 | 7.5 |
| 16 | ○ | 1.4 | 1 | 93 | 480 | 2.7 | 7.7 |
| 17 | ○ | 1.3 | 1 | 97 | 520 | 2.5 | 7.8 |
| 18 | X | — | — | — | — | — | — |
| 19 | X | — | — | — | — | — | — |
| 20 | ○ | 2.8 | 1 | 80 | 740 | 6.2 | 15.8 |
| 21 | ○ | 0.8 | 5 | 80 | 740 | 1.8 | 2.5 |

On the other hand, Comparative Example 15 in Table 1 is a rolled copper foil to which the alloy components of the present invention were not added. An ingot produced by fusing and casting oxygen-free copper in an Ar atmosphere was processed into foil, after which this was adhered, under identical conditions, to a polyimide film, by using the same adhesive used for the examples according to the invention. Because the raw material was pure copper, the conductivity was high. However, the 180° peel strength was low (7.5 N/cm), so there was insufficient adhesive strength, leading to concern that it might peel off after being applied to a printed wiring board.

Comparative Examples 16 and 17 were processed into foil by means of the method used for the examples according to the invention, after adding only Cr or Zr, respectively. Because the Cr and Zr concentrations were less than 0.01% by weight, they were ineffective in improving the strength. Their tensile strengths were low (less than 600 N/mm$^2$), and their 180° peel strengths also were low (less than 8.0 N/cm).

In Comparative Example 18, Cr was added, but it was added in a concentration exceeding 2.0 weight percent, so coarse Cr crystallization products occurred during casting and cracks occurred during hot rolling, resulting in poor hot rollability. In Comparative Example 19, only Zr was added, but its concentration exceeded 1.0 weight percent, so cracks similarly occurred during hot rolling. As a result, Comparative Examples 18 and 19 could not be subjected to subsequent testing.

Comparative Example 20 was processed by lightly scraping the surface of the alloy foil of Example 7 with emery paper to roughen it. As a result of the increase in the surface roughness, the impedance is increased by the skin effect when a current circulates at high frequency, so it is unsuitable for applications requiring a conductive material in a high-frequency circuit.

Comparative Example 21 was processed by immersing the alloy foil of Example 7 in an aqueous solution containing the anticorrosive agent benzotriazole regulated at 0.5% (5000 ppm) concentration. Because the anticorrosive agent concentration was high, the anticorrosive coating was thick (5 nm), so the 180° peel strength was low (2.5 N/cm).

(2) Embodiment 2

Table 3 lists the composition of the copper alloy foil containing Ni and Si according to the second embodiment of the invention, and Table 4 lists the results of the evaluation of the properties of the copper alloy foil. Examples 22–31 are examples of the copper alloy foil of the present invention. As is evident in Table 4, the copper alloy foil of the present invention had a conductivity exceeding 40% IACS, a tensile strength of at least 650 N/mm$^2$, and a 180° peel strength exceeding 8.0 N/cm, when adhered to a polyimide film. It is evident that their conductivities are within the demanded range, and they have high handleability and high adhesive strength. Also, none developed cracks during hot rolling.

TABLE 3

| | Chemical Composition | | | | | | | | | | | | | |
|---|---|---|---|---|---|---|---|---|---|---|---|---|---|---|
| | (%) | | | | | | | | | | | | | Cu & Unavoidable |
| No. | Ni | Si | Ag | Al | Be | Co | Fe | Mg | P | Pb | Sn | Ti | Zn | Impurities |
| Examples of the invention | | | | | | | | | | | | | | |
| 22 | 1.4 | 0.33 | — | — | — | — | — | — | — | — | — | — | — | Remainder |
| 23 | 2.5 | 0.52 | — | — | — | — | — | — | — | — | — | — | — | Remainder |

TABLE 3-continued

| | Chemical Composition | | | | | | | | | | | | | |
|---|---|---|---|---|---|---|---|---|---|---|---|---|---|---|
| | (%) | | | | | | | | | | | | | Cu & Unavoidable |
| No. | Ni | Si | Ag | Al | Be | Co | Fe | Mg | P | Pb | Sn | Ti | Zn | Impurities |
| 24 | 3.1 | 0.62 | — | — | — | — | — | — | — | — | — | — | — | Remainder |
| 25 | 2.5 | 0.74 | 0.09 | — | — | — | — | — | — | — | — | — | 0.24 | Remainder |
| 26 | 2.4 | 0.64 | — | — | — | — | — | 0.15 | — | — | — | 0.3 | — | Remainder |
| 27 | 3.1 | 0.39 | — | — | — | — | 0.3 | — | — | — | 0.58 | — | — | Remainder |
| 28 | 2.8 | 0.37 | — | 0.55 | — | — | — | — | — | 0.06 | — | — | — | Remainder |
| 29 | 3.2 | 0.71 | — | — | — | — | — | — | 0.04 | — | — | — | 0.10 | Remainder |
| 30 | 1.7 | 0.54 | — | — | — | — | — | 0.05 | — | — | — | 0.54 | — | Remainder |
| 31 | 2.6 | 0.48 | — | — | 0.11 | 0.6 | — | — | — | — | — | — | — | Remainder |
| Comparative examples | | | | | | | | | | | | | | |
| 32 | — | — | — | — | — | — | — | — | — | — | — | — | — | Remainder |
| 33 | 3.5 | 0.04 | — | — | — | — | — | — | — | — | — | — | — | Remainder |
| 34 | 0.65 | 0.22 | — | — | — | — | — | — | — | — | — | — | — | Remainder |
| 35 | 5.2 | 0.39 | — | — | — | — | — | — | — | — | — | — | — | Remainder |
| 36 | 3.2 | 1.9 | — | — | — | — | — | — | — | — | — | — | — | Remainder |
| 37 | 2.4 | 0.48 | — | — | — | — | — | — | — | — | — | 3.0 | — | Remainder |
| 38 | 2.5 | 0.52 | — | — | — | — | — | — | — | — | — | — | — | Remainder |
| 39 | 2.5 | 0.52 | — | — | — | — | — | — | — | — | — | — | — | Remainder |

TABLE 4

| No. | Hot Rollability (○: good X: poor) | Surface Defects (○: good X: poor) | Surface Roughness (Rz) (μm) | Thickness of Anticorrosive Coating (nm) | Conductivity (% IACS) | Tensile Strength (N/mm²) | Impedance (Ω) | 180° Peel Strength (N/cm) |
|---|---|---|---|---|---|---|---|---|
| Examples of the invention | | | | | | | | |
| 22 | ○ | ○ | 1.0 | 1 | 64 | 660 | 2.5 | 8.6 |
| 23 | ○ | ○ | 1.0 | 1 | 52 | 750 | 2.6 | 10.3 |
| 24 | ○ | ○ | 1.1 | 1 | 48 | 800 | 2.8 | 12.1 |
| 25 | ○ | ○ | 0.9 | 1 | 51 | 790 | 2.3 | 8.8 |
| 26 | ○ | ○ | 0.8 | 2 | 48 | 650 | 2.2 | 12.2 |
| 27 | ○ | ○ | 0.9 | 2 | 42 | 720 | 2.8 | 8.4 |
| 28 | ○ | ○ | 0.8 | 2 | 41 | 730 | 2.8 | 9.0 |
| 29 | ○ | ○ | 1.2 | 1 | 62 | 820 | 2.9 | 9.3 |
| 30 | ○ | ○ | 1.0 | 1 | 56 | 660 | 2.6 | 11.0 |
| 31 | ○ | ○ | 1.1 | 2 | 50 | 810 | 2.7 | 11.1 |
| Comparative examples | | | | | | | | |
| 32 | ○ | ○ | 1.0 | 1 | 99 | 400 | 2.4 | 7.5 |
| 33 | ○ | ○ | 0.8 | 1 | 37 | 610 | 1.7 | 10.6 |
| 34 | ○ | ○ | 0.9 | 2 | 68 | 640 | 2.0 | 7.8 |
| 35 | ○ | X | 1.2 | 2 | 38 | 800 | 3.1 | 11.6 |
| 36 | X | — | — | — | — | — | — | — |
| 37 | ○ | ○ | 1.0 | 2 | 14 | 930 | 2.8 | 11.4 |
| 38 | ○ | ○ | 3.5 | 1 | 52 | 750 | 6.0 | 11.7 |
| 39 | ○ | ○ | 1.0 | 5 | 52 | 750 | 2.6 | 4.0 |

On the other hand, Comparative Example 32 listed in Table 3 is a rolled copper foil to which the alloy components of the present invention were not added. An ingot produced by fusing and casting oxygen-free copper in an Ar atmosphere was processed into foil, after which this was adhered, under conditions identical to those used for Examples 22–31, to a polyimide film, by using the same adhesive used for Examples 22–31. Because the raw material was pure copper, the conductivity was high. However, the 180° peel strength was low (7.5 N/cm), so insufficient adhesive strength was obtained, leading to concern that it might peel off after being applied to a printed wiring board.

Comparative Examples 33 and 34 were processed into foil by means of the method used for Examples 22–31, after adding Ni and Si. In Comparative Example 33, the Si concentration was less than 0.2 weight percent, so the tensile strength was low (<650 N/mm²), and the conductivity also was low (<40% IACS). Also, in Comparative Example 34, the Ni concentration was less than 1.0 weight percent, so it was insufficient to improve the adhesion. The 180° peel strength was low (<8.0 N/cm), and the tensile strength also was low (<650 N/mm²).

Ni and Si were added in Comparative Example 35. The Ni was added in a concentration exceeding 4.8 weight percent, so coarse crystallization products occurred, resulting in many surface defects, which reduced the conductivity, Although Ni and Si were added in Comparative Example 36, the Si was added in a concentration exceeding 1.4 weight percent, so cracks occurred during hot rolling, thereby degrading the hot rollability. As a result, Comparative Example 36 could not be subjected to subsequent testing.

In Comparative Example 37, Ti was added in addition to Ni and Si, but Ti was added in a concentration exceeding 2.5 percent by weight, so the conductivity was low, making it unsuitable as a conductive material in a printed wiring board.

In Comparative Example 38, the surface of the alloy foil of Example 23 was lightly scraped with emery paper to roughen it. As a result, when the surface roughness increases, the impedance is increased by the skin effect when a current circulates at high frequency, so it is unsuitable for applications requiring a conductive material in a high-frequency circuit.

In Comparative Example 39, the alloy foil of Example 23 was immersed in an aqueous solution containing the anticorrosive agent benzotriazole regulated at 0.5% (5000 ppm) concentration. Because the anticorrosive agent concentration was high, the anticorrosive coating was thick (5 nm), so the 180° peel strength was low (4.0 N/cm).

When used for a printed wiring board laminate that is adhered to a polyimide resin film by using an adhesive containing an epoxy resin, the copper alloy foil of the present invention has low surface roughness and superior adhesion, and it has high conductivity and strength. For these reasons, it is ideal for applications requiring a conductive material for an electronic circuit that requires fine wiring.

What is claimed is:

1. Copper alloy foil for lamination with a resin substrate, the copper alloy foil consisting of at least one of 0.01–2.0 weight percent Cr and 0.01–1.0 weight percent Zr, a balance to total 100 weight percent being copper and unavoidable impurities, said copper alloy foil having an anticorrosive coating of thickness less than 3 nm, said copper alloy foil having a surface exhibiting no artificial roughening and having a surface roughness less than 2 $\mu$m, expressed as ten-point average surface roughness, tensile strength at least 620 N/mm$^2$ and conductivity at least 64% IACS, and 180° peel strength between the copper alloy foil and an adhesive containing an epoxy resin bonding the copper alloy foil to a resin substrate is at least 8.9 N/cm.

2. Copper alloy foil according to claim 1, wherein said anticorrosive coating consists essentially of at least one nitrogen-containing organic compound which forms a chelate with said copper.

3. Copper alloy foil according to claim 2, wherein said organic compound is selected from the group consisting of benzotriazole and imidazole.

4. Copper alloy foil according to 1, wherein said resin of said resin foil is a polyimide.

5. A laminate consisting essentially of a copper alloy foil according to claim 1, and a resin substrate laminated thereon.

6. A laminate consisting essentially of the laminate according to claim 5, and a resin-containing adhesive, bonding said copper alloy foil to said resin substrate.

7. The laminate of claim 6, wherein said resin of said resin-containing adhesive consists essentially of an epoxy.

8. Copper alloy foil for lamination with a resin substrate, the copper alloy foil consisting of 0.01–2.0 weight percent Cr and 0.01–1.0 weight percent Zr, a balance to total 100 weight percent being copper and unavoidable impurities, said copper alloy foil having an anticorrosive coating of thickness less than 3 nm, said copper alloy foil having a surface exhibiting no artificial roughening and having a surface roughness less than 2 $\mu$m, expressed as ten-point average surface roughness, tensile strength at least 620 N/mm$^2$ and conductivity at least 64% IACS, and 180° peel strength between the copper alloy foil and an adhesive containing an epoxy resin bonding the copper alloy foil to a resin substrate is at least 8.9 N/cm.

9. Copper alloy foil according to claim 8, wherein said anticorrosive coating consists essentially of at least one nitrogen-containing organic compound which forms a chelate with said copper.

10. Copper alloy foil according to claim 9, wherein said organic compound is selected from the group consisting of benzotriazole and imidazole.

11. Copper alloy foil according to claim 8, wherein said resin of said resin foil is a polyimide.

12. A laminate consisting essentially of a copper alloy foil according to claim 8, laminated with a resin substrate.

13. A laminate consisting essentially of the copper alloy foil according to claim 8, a resin substrate laminated thereto, and a resin-containing adhesive, bonding said copper alloy foil to said resin substrate.

14. The laminate of claim 13, wherein said resin of said resin-containing adhesive consists essentially of an epoxy.

15. Copper alloy foil for lamination with a resin substrate, the copper alloy foil consisting of 0.01–2.0 weight percent Cr, with a balance to total 100 weight percent being copper and unavoidable impurities, said copper alloy foil having an anticorrosive coating of thickness less than 3 nm, said copper alloy foil having a surface exhibiting no artificial roughening and having a surface roughness less than 2 $\mu$m, expressed as ten-point average surface roughness, tensile strength at least 620 N/mm$^2$ and conductivity at least 64% IACS, and 180° peel strength between the copper alloy foil and an adhesive containing an epoxy resin bonding the copper alloy foil to a resin substrate is at least 8.9 N/cm.

16. Copper alloy foil according to claim 15, wherein said anticorrosive coating consists essentially of at least one nitrogen-containing organic compound which forms a chelate with said copper.

17. Copper alloy foil according to claim 16, wherein said organic compound is selected from the group consisting of benzotriazole and imidazole.

18. Copper alloy foil according to claim 15, wherein said resin of said resin foil is a polyimide.

19. A laminate consisting essentially of a copper alloy foil according to claim 15, laminated with a resin substrate.

20. A laminate consisting essentially of the copper alloy foil according to claim 15, a resin substrate laminated thereto, and a resin-containing adhesive, bonding said copper alloy foil to said resin substrate.

21. The laminate of claim 20, wherein said resin of said resin-containing adhesive consists essentially of an epoxy.

22. Copper alloy foil for lamination with a resin substrate, the copper alloy foil consisting of 0.01–1.0 weight percent Zr, with a balance to total 100 weight percent being copper and unavoidable impurities, said copper alloy foil having an anticorrosive coating of thickness less than 3 nm, said copper alloy foil having a surface exhibiting no artificial roughening and having a surface roughness less than 2 $\mu$m, expressed as ten-point average surface roughness, tensile strength at least 620 N/mm$^2$ and conductivity at least 64% IACS, and 180° peel strength between the copper alloy foil and an adhesive containing an epoxy resin bonding the copper alloy foil to a resin substrate is at least 8.9 N/cm.

23. Copper alloy foil according to claim 22, wherein said anticorrosive coating consists essentially of at least one nitrogen-containing organic compound which forms a chelate with said copper.

24. Copper alloy foil according to claim 23, wherein said organic compound is selected from the group consisting of benzotriazole and imidazole.

25. Copper alloy foil according to claim 22, wherein said resin of said resin foil is a polyimide.

26. A laminate consisting essentially of a copper alloy foil according to claim 22, laminated with a resin substrate.

27. A laminate consisting essentially of the copper alloy foil according to claim 22, a resin substrate laminated thereto, and a resin-containing adhesive, bonding said copper alloy foil to said resin substrate.

28. The laminate of claim 27, wherein said resin of said resin-containing adhesive consists essentially of an epoxy.

* * * * *